(12) United States Patent
Tseng et al.

(10) Patent No.: US 9,460,992 B2
(45) Date of Patent: Oct. 4, 2016

(54) PACKAGING SUBSTRATE HAVING A THROUGH-HOLED INTERPOSER

(71) Applicant: Unimicron Technology Corporation, Taoyuan (TW)

(72) Inventors: Tzyy-Jang Tseng, Taoyuan (TW); Dyi-Chung Hu, Taoyuan (TW); Ying-Chih Chan, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 14/641,901

(22) Filed: Mar. 9, 2015

(65) Prior Publication Data

US 2015/0187692 A1    Jul. 2, 2015

Related U.S. Application Data

(62) Division of application No. 13/845,625, filed on Mar. 18, 2013, now Pat. No. 8,981,570.

(30) Foreign Application Priority Data

Jul. 26, 2012   (TW) .............................. 101126991 A

(51) Int. Cl.
*H01L 23/498*        (2006.01)
*H01L 23/48*         (2006.01)
(Continued)

(52) U.S. Cl.
CPC ....... *H01L 23/49838* (2013.01); *H01L 21/486* (2013.01); *H01L 21/4867* (2013.01); *H01L 21/56* (2013.01); *H01L 21/563* (2013.01); *H01L 21/768* (2013.01); *H01L 23/3128* (2013.01); *H01L 23/481* (2013.01); *H01L 23/49811* (2013.01); *H01L 23/49827* (2013.01); *H05K 1/115* (2013.01); *H01L 23/49816* (2013.01); *H01L 23/49822* (2013.01); *H01L 24/16* (2013.01); *H01L 25/0655* (2013.01);
(Continued)

(58) Field of Classification Search
CPC ... H01L 23/481; H01L 21/768; H01L 21/56; H01L 23/3128; H01L 21/563; H01L 25/0655; H01L 2224/32225; H01L 2924/15311; H01L 2924/00
USPC ................ 257/774, 771, 773, 777, E21.532; 438/127, 629, 637
See application file for complete search history.

(56) References Cited

U.S. PATENT DOCUMENTS

| 5,283,104 A | 2/1994 | Aoude et al. |
| 7,982,298 B1 * | 7/2011 | Kang ..................... H01L 25/03 257/686 |

(Continued)

FOREIGN PATENT DOCUMENTS

| CN | 2562369 Y | 7/2003 |
| CN | 102543927 A | 7/2012 |

(Continued)

*Primary Examiner* — Thinh T Nguyen
(74) *Attorney, Agent, or Firm* — Jianq Chyun IP Office

(57) ABSTRACT

A through-holed interposer is provided, including a board body, a conductive gel formed in the board body, and a circuit redistribution structure disposed on the board body. The conductive gel has one end protruding from a surface of the board body, and an area of the protruded end of the conductive gel that is in contact with other structures (e.g., packaging substrates or circuit structures) is increased, thereby strengthening the bonding of the conductive gel and reliability of the interposer.

6 Claims, 7 Drawing Sheets

(51) Int. Cl.
*H01L 21/768* (2006.01)
*H01L 21/56* (2006.01)
*H01L 23/31* (2006.01)
*H01L 21/48* (2006.01)
*H05K 1/11* (2006.01)
*H01L 25/065* (2006.01)
*H01L 23/00* (2006.01)

(52) U.S. Cl.
CPC ............... *H01L 2224/131* (2013.01); *H01L 2224/16238* (2013.01); *H01L 2224/32225* (2013.01); *H01L 2224/73204* (2013.01); *H01L 2924/15174* (2013.01); *H01L 2924/15311* (2013.01)

(56) References Cited

U.S. PATENT DOCUMENTS

| | | |
|---|---|---|
| 8,183,151 B2 | 5/2012 | Lake |
| 2003/0022417 A1 | 1/2003 | Steele et al. |
| 2007/0290300 A1* | 12/2007 | Kawakami ............ H01L 23/481 257/621 |
| 2008/0230264 A1 | 9/2008 | Chang |
| 2008/0272497 A1* | 11/2008 | Lake .................... H01L 21/486 257/774 |
| 2009/0293271 A1* | 12/2009 | Tanaka ............. H01L 23/49827 29/832 |
| 2010/0237483 A1* | 9/2010 | Chi ..................... H01L 21/565 257/686 |
| 2010/0300737 A1* | 12/2010 | Sato .................... H01L 23/5389 174/260 |
| 2012/0153468 A1 | 6/2012 | Lee |
| 2014/0027925 A1 | 1/2014 | Tseng et al. |

FOREIGN PATENT DOCUMENTS

| | | |
|---|---|---|
| JP | 2005-347513 | 12/2005 |
| TW | 200931612 | 7/2009 |

* cited by examiner

PACKAGING SUBSTRATE HAVING A THROUGH-HOLED INTERPOSER

CROSS-REFERENCE TO RELATED APPLICATIONS

This application is a divisional of copending application U.S. Ser. No. 13/845,625, filed on Mar. 18, 2013, being issued as U.S. Pat. No. 8,981,570 with an issue date of Mar. 17, 2015, which claims under 35 U.S.C. §119(a) the benefit of Taiwanese Application No. 101126991, filed Jul. 26, 2012, the entire contents of which are incorporated herein by reference.

BACKGROUND OF THE INVENTION

1. Field of the Invention

This invention relates to through silicon via techniques, and, more particularly, to a through-holed interposer, a packaging substrate, and methods of fabricating the same.

2. Description of Related Art

With the rapid development of the electronic industry, electronic products are produced to be light-weighted and low-profiled and have various functionalities. FIG. 1 is a cross-sectional view of a flip-chip package structure 1 according to the prior art.

As shown in FIG. 1, the package structure 1 comprises a packaging substrate 10 having a first surface 10a and a second surface 10b. Flip-chip soldering pads 100 are disposed on the first surface 10a of the packaging substrate 1 and electrically connected to electrode pads 120 of a semiconductor chip 12 through solder bumps 11. An underfill 13 is formed between the first surface 10a of the packaging substrate 10 and the semiconductor chip 12 and encapsulates the solder bumps 11. Ball implanting pads 101 are disposed on the second surface 10b of the packaging substrate 10, and are electrically connected through solder balls 14 to another electronic device (not shown) such as a printed circuit board.

As the semiconductor chip 12 is developed to have a critical dimension less than 45 nm, an extreme low-k dielectric (ELK) or ultra low-K (ULK) dielectric material is employed in a back-end of line (BEOL). However, the low-k dielectric material is porous and fragile. As a result, the semiconductor chip 12 is easily cracked due to too great the difference between the thermal expansion coefficients (CTE) of the packaging substrate 10 and the semiconductor chip 12.

With the demands of lighter, smaller electronic products, the semiconductor chip 12 is required to have a high layout density in nano-meter scale, and pitches among electrode pads 120 also become smaller and smaller. However, the pitches of the flip-chip soldering pads 100 of the packaging substrate 10 is in micro-meters. Although the semiconductor chip 12 having a high density layout has come to the market, no packaging substrate is available to cooperate with the semiconductor chip 12.

Therefore, how to overcome the problems of the prior art is becoming one of the most popular issues in the art.

SUMMARY OF THE INVENTION

In view of the above-mentioned problems of the prior art, an interposer is disposed between a packaging substrate and a semiconductor additionally. The interposer has through-silicon vias (TSVs) and a redistribution layer (RDL) formed on the TSVs. One end of each of the TSV is connectable to a flip-chip soldering pad of the package structure that has a greater pitch, and the redistribution layer is electrically connected to electrode pads of the semiconductor chip that have smaller pitches. Therefore, the packaging substrate can carry the semiconductor chip that has a high layer density.

The present invention provides a through-holed interposer, comprising: a board body having opposing first and second surfaces and a plurality of through holes connecting the first surface and the second surface; a conductive gel formed in each of the through holes and having a first end protruded from the first surface of the board body; and a circuit redistribution structure disposed on the second surface of the board body and a second end of the conductive gel and electrically connected to the second end of the conductive gel.

Given the above, in the through-holed interposer the first end of the conductive gel protrudes from the first surface of the board body, and an area of the first end of the conductive gel that is in contact with other structures (e.g., packaging substrates or circuit structures) is increased, thereby strengthening the bonding of the conductive gel and reliability of the interposer.

The present invention further provides a packaging substrate, including: an interposer having opposing first and second surfaces and a plurality of conductive gels interconnecting the first surface and the second surface, wherein each of the conductive gels has opposing first and second ends, such that the first end protrudes from the first surface of the interposer, and a circuit redistribution structure is disposed on the second surface of the interposer and electrically connected to the second ends of the conductive gels; a encapsulating layer that encapsulates a periphery of the interposer and the first surface; and a circuit built-up structure disposed on the encapsulating layer above the first surface of the interposer and electrically connected to the first ends of the conductive gels.

Given the above, in the packaging substrate the interposer is embedded in the encapsulating layer, in order to reduced the thickness of the overall package structure. Since the interposer and a silicon wafer have similar or the same CTE, the reliability of thermal cycling test is improved. As compared with the flip-chip packaging substrate of the prior art, disposing a semiconductor chip on an interposer of the packaging substrate improves the reliability of electronic products.

The present invention also provides methods of fabricating the through-holed interposer and the packaging substrate, which are detained in the following paragraphs.

BRIEF DESCRIPTION OF DRAWINGS

The invention can be more fully understood by reading the following detailed description of the preferred embodiments, with reference made to the accompanying drawings, wherein.

DETAILED DESCRIPTION OF THE INVENTION

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

FIGS. 2A to 2H are cross-sectional views illustrating a method of fabricating a through-holed interposer 2 according to the present invention.

Figure 1:
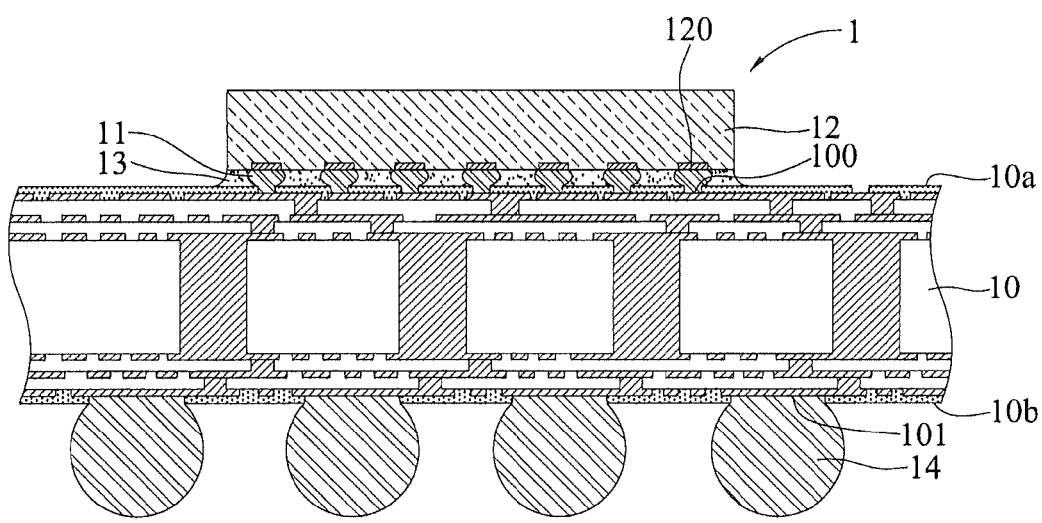
FIG. 1 is a cross-sectional view of a flip-chip semiconductor package structure according to the prior art.
Figure 2A:
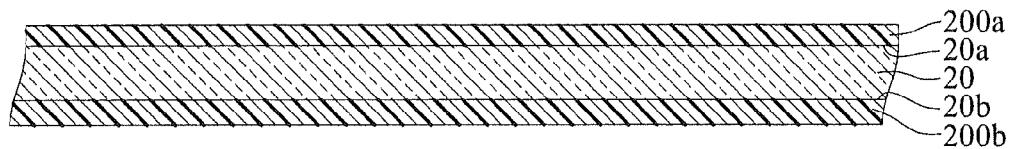
FIGS. 2A to 2H are cross-sectional views illustrating a method of fabricating a through-holed interposer according to the present invention, wherein FIG. 2H' shows a different embodiment from FIG. 2H.

As shown in FIG. 2A, a board body 20 has opposing first surface 20a and second surface 20b, and a first protection layer 200a and a second protection layer 200b are formed on the first surface 20a and the second surface 20b, respectively.

In an embodiment, the board body 20 is made of a semiconductor material, such as single crystalline silicon, polycrystalline silicon, and gallium arsenide, or made of an insulating material, such as glass and ceramic, such as $Al_2O_3$ or AlN.

Figure 2B:
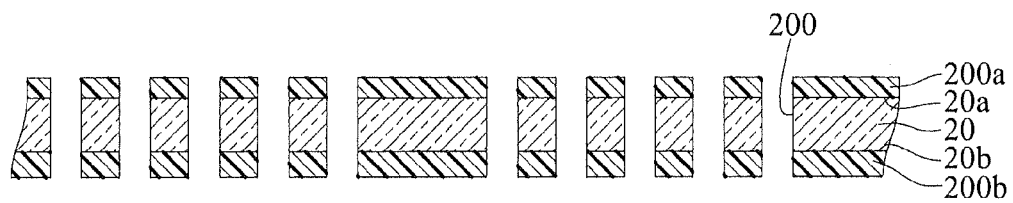

As shown in FIG. 2B, a plurality of through holes 200 connecting the first surface 20a and the second surface 20b of the board body 20 and extending to the first protection layer 200a and the second protection layer 200b are formed.

Figure 2C:
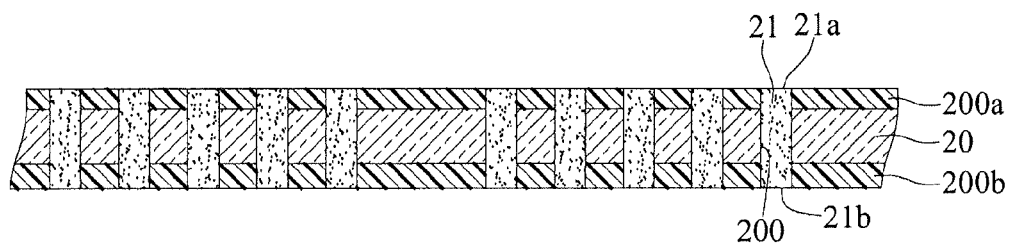

As shown in FIG. 2C, a conductive gel 21 is formed in each of the through holes 200. The conductive gel 21 has opposing first end 21a and second end 21b.

In an embodiment, the conductive gel 21 is formed by applying and filling, and is made of copper or composite copper (e.g., electroless copper and copper gel).

If the board body 20 is made of the semiconductor material, an insulating layer such as silicon dioxide may be formed on hole walls of the through holes 200, and then the conductive gel 21 is formed.

Figure 2D:
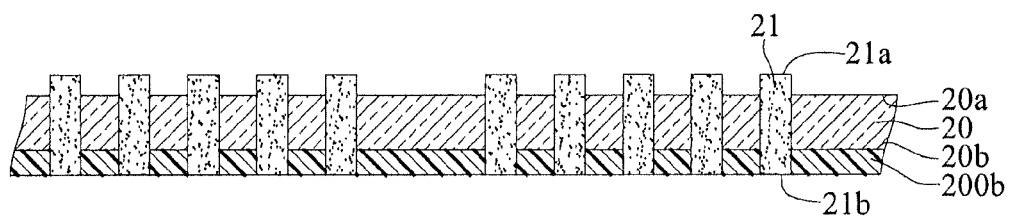

As shown in FIG. 2D, the first protection layer 200a is removed, allowing the first end 21a of the conductive gel 21 to protrude from the first surface 20a of the board body 20.

Figure 2E:
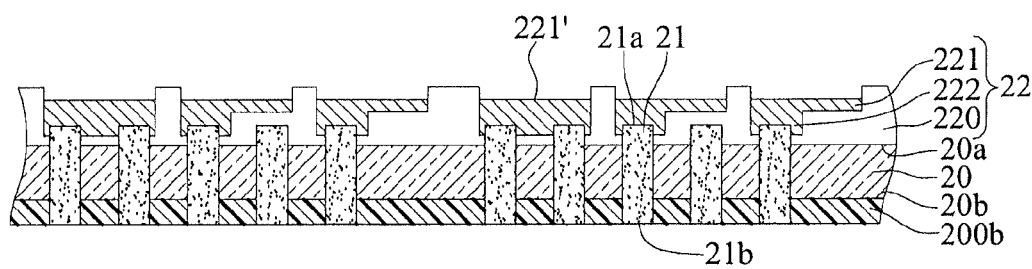

As shown in FIG. 2E, a first circuit redistribution structure 22 is formed on the first surface 20a of the board body 20 and the first end 21a of the conductive gel 21, and is electrically connected to the first end 21a of the conductive gel 21.

In an embodiment, the first circuit redistribution structure 22 has at least a redistribution dielectric layer 220 and redistribution circuit layers 221,221' formed on the redistribution dielectric layer 220. A portion of the redistribution circuit layer 221' is electrically connected to the first end 21a of the conductive gel 2.

In an embodiment, the redistribution circuit layer 221 is embedded in the redistribution dielectric layer 220. In another embodiment, the redistribution circuit layer 221 may be formed on a surface of the redistribution dielectric layer 220.

In an embodiment, the first circuit redistribution structure 22 further has a plurality of redistribution conductive vias 222 formed in the redistribution dielectric layer 220 and electrically connected to the redistribution circuit layer 221 and the first end 21a of the conductive gel 21. Through the circuit groove design, the first circuit redistribution structure 22 can be electrically connected to the first end 21a of the conductive gel 21 through the redistribution conductive vias 222 or the redistribution circuit layer 221'.

In another embodiment, the first circuit redistribution structure 22 is a multi-layer circuit, and is not limited to the above-described single-layer circuit.

Figure 2F:
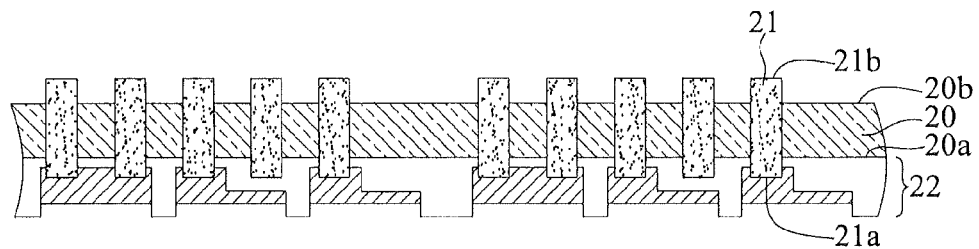

As shown in FIG. 2F, the second protection layer 200b is removed, allowing the second end 21b of the conductive gel 21 to be exposed from the second surface 20b of the board body 20, and the second end 21b of the conductive gel 21 protrudes to the second surface 20b of the board body 20.

Figure 2G:
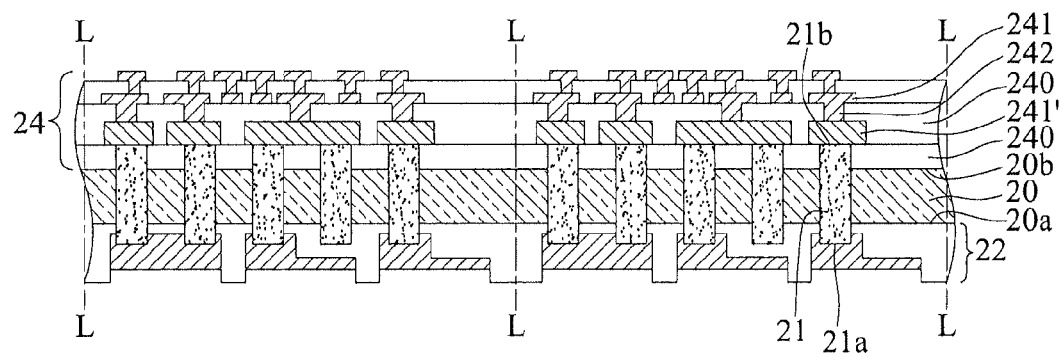

As shown in FIG. 2G, a second circuit redistribution structure 24 is disposed on the second surface 20b of the board body 20 and the second end 21b of the conductive gel 21 and is electrically connected to the second end 21b of the conductive gel 21.

In an embodiment, the second circuit redistribution structure 24 has at least a redistribution dielectric layer 240 and redistribution circuit layers 241, 241' formed on the redistribution dielectric layer 240, and a portion of the redistribution circuit layer 241' (i.e., the innermost layer) is electrically connected to the second end 21b of the conductive gel 21.

In an embodiment, the second circuit redistribution structure 24 further has a plurality of redistribution conductive vias 242 formed on a portion of the redistribution dielectric layer 240 and are electrically connected to the redistribution circuit layer 241, 241'.

The innermost layer of the redistribution dielectric layer 240 has a surface flush with that of the second end 21b of the conductive gel 21, and is in direct contact with the surface of the second end 21b of the conductive gel 21 and electrically connected to the second end 21b of the conductive gel 21. Therefore, the innermost layer of the redistribution circuit layer 241' can be still electrically connected to the second end 21b of the conductive gel 21, without going through the redistribution conductive vias 242. Alternatively, the innermost layer of the redistribution dielectric layer 240 has a surface lower (not shown) than that of the second end 21b of the conductive gel 21, and the second end 21b of the conductive gel 21 is embedded (not shown) in the innermost layer of the redistribution circuit layer 241'.

In another embodiment of the second circuit redistribution structure, the redistribution circuit layer can be embedded in the redistribution dielectric layer.

Figure 2H:
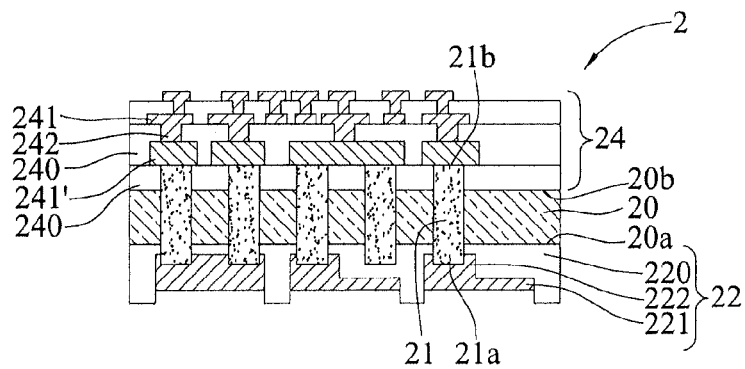
Figure 2H:
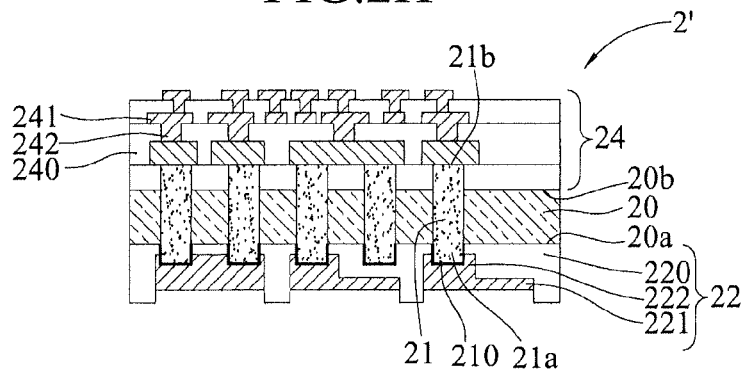

As shown in FIG. 2H, a singulation process is performed along a cutting line L shown in FIG. 2G, to obtain a plurality of through-holed interposers 2.

As shown in FIG. 2H', a copper gel, after formed in the shape of a pillar, generally has a porous structure. Medicinal liquid is likely to be remained in the porous structure and affect the conductivity quality. In another embodiment, prior to the process of forming the first circuit redistribution structure 22 shown in FIG. 2E, a surface treatment layer 210 can be formed on the first end 21a of the conductive gel 21, to cover the porous structure.

In an embodiment, the surface treatment layer 210 is greater than 3 um in thickness, and the surface treatment layer 210 is made of Electroless Nickel/Immersion Gold (Ni/Au), Electroless Nickel/Immersion Gold (ENIG), Electroless Nickel Electroless Palladium Immersion Gold (EN-EPIG), or copper electroless or electroplating.

Figure 2I:
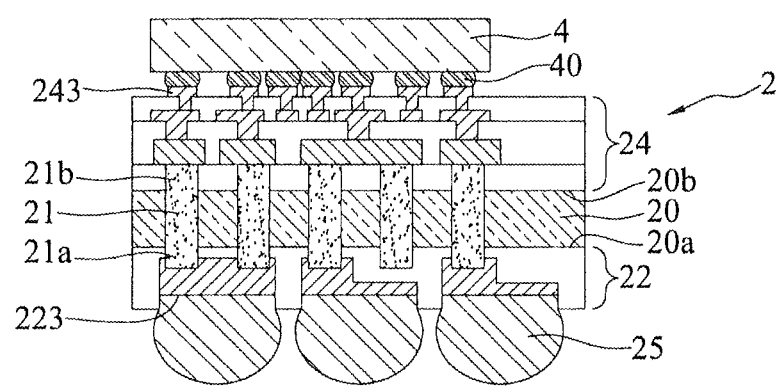
FIG. 2I is a cross-sectional view of a subsequent application of a through-holed interposer according to the present invention.

As shown in FIG. 2I, a package structure is formed by applying the present invention. A semiconductor chip 4 is bonded by first solder bumps 40, and electrically connected to conductive pads 243 disposed on the outermost side of the second circuit redistribution structure 24 of the through-holed interposer 2. Conductive pads 223 disposed on the outermost side of the first circuit redistribution structure 22 of the through-holed interposer 2 are electrically connected to a packaging substrate (not shown) via second solder bumps 25.

In an embodiment, the through-holed interposer 2,2' is disposed between the packaging substrate and the semiconductor chip 4, allowing the bottom end of the through-holed interposer 2,2' to be electrically connected through the second solder bumps 25 to soldering pads disposed on the packaging substrate that have a greater pitch, and the conductive pads 243 of the second circuit redistribution structure 24 to be electrically connected through the first solder bumps 40 to electrode pads disposed on the semiconductor chip 4 that have a smaller pitch. A underfill (not shown) is suggested to fills between the semiconductor chip 4 and the through-holed interposer 2,2', and between the through-holed interposer 2,2' and the packaging substrate, allowing the packaging substrate to be combined with the semiconductor chip 4 that has electrode pads in a high layout density. With the through-holed interposer 2,2', the problem of the shortage of a suitable packaging substrate is solved, and the IC industry does not need to change its original supply chain and infrastructure.

By disposing the semiconductor chip 4 on the through-holed interposer 2,2' and with the same or similar coefficients of thermal expansions (CTE) (i.e., 2.6 ppm) of the through-holed interposer 2,2' and the semiconductor chip 4, the first solder bumps 40 between the semiconductor chip 4 and the through-holed interposer 2,2' are prevented to be cracked. Therefore, disposition of the semiconductor chip 4 on the through-holed interposer 2,2' increases the product reliability, as compared with the flip-chip packaging substrate according to the prior art.

With the first end 21a of the conductive gel 21 that is protruded from the first surface 20a of the board body 20, an area of the first circuit redistribution structure 22 that is in contact with the first end 21a of the conductive gel 21 is increased, and a bonding force between the conductive gel 21 and the first circuit redistribution structure 22 is increased accordingly. For example, the first end 21a of the conductive gel 21 can be embedded into the redistribution circuit layer 221' or the redistribution conductive vias 222. Therefore, the reliability of the through-holed interposer 2,2' in enhanced.

Since the second end 21b of the conductive gel 21 is also protruded from the second surface 20b of the board body 20, an area of the second circuit redistribution structure 24 that is in contact with the second end 21b of the conductive gel 21 is also increased. Accordingly, a bonding force between the conductive gel 21 and the second circuit redistribution structure 24 is increased, and the reliability of through-holed interposer 2,2' is enhanced.

The present invention further provides a through-holed interposer 2,2'. As shown in FIG. 2H, through-holed interposer 2,2' comprises a board body 20, a plurality of conductive gels 21, a first circuit redistribution structure 22 and a second circuit redistribution structure 24.

The board body 20 has opposing first surface 20a and second surface 20b, and a plurality of through holes in communication with the first and second surfaces 20a, 20b.

The conductive gels 21 are formed in the through holes 200. Each of the conductive gels 21 has opposing first end 21a and second end 21b. The first end 21a of the conductive gel 21 protrudes from the first surface 20a of the board body 20, and the second end 21b of the conductive gel 21 protrudes from the second surface 20b of the board body 20. In another embodiment, a surface treatment layer 210 is formed on first end 21a of the conductive gel 21.

The first circuit redistribution structure 22 is disposed on the first surface 20a of the board body 20 and the first end 21a of the conductive gel 21. The first circuit redistribution structure 22 has at least a redistribution dielectric layer 220, redistribution circuit layers 221,221' formed on the redistribution dielectric layer 220, and a plurality of redistribution conductive vias 222 formed in the redistribution dielectric layer 220 and electrically connected to a portion of the redistribution circuit layer 221. A portion of the redistribution circuit layer 221' is electrically connected to the first end of the conductive gel. A portion of the redistribution circuit layer 221 is electrically connected through the redistribution conductive vias 222 to the first end 21a of the conductive gel 21. In an embodiment, the redistribution circuit layers 221,221' are embedded in the redistribution dielectric layer 220.

The second circuit redistribution structure 24 is disposed on the second surface 20b of the board body 20 and the second end 21b of the conductive gel 21. The second circuit redistribution structure 24 has at least a redistribution dielectric layer 240, redistribution circuit layers 241, 241' formed on the redistribution dielectric layer 240, and a plurality of redistribution conductive vias 242 formed on a portion of the redistribution dielectric layer 240 and electrically connected to the redistribution circuit layers 241, 241'. A portion of the redistribution circuit layer 241' is electrically connected to the second end 21b of the conductive gel 21.

FIGS. 3A to 3J are cross-sectional views illustrating a method of fabricating a packaging substrate 3 according to the present invention.

Figure 3A:
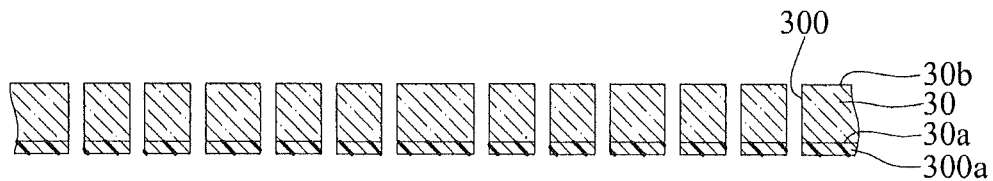
FIGS. 3A to 3J are cross-sectional views illustrating a method of fabricating a through-holed interposer according to the present invention, wherein FIG. 3G' shows a different embodiment from FIG. 3G.

As shown in FIG. 3A, a board body 30 having opposing first surface 30a and second surface 30b is provided. The board body 30 has a protection layer 300a on the first surface 30a.

Then, a plurality of through holes 300 are formed to interconnect the first and second surfaces 30a, 30b of the board body 30 and extend to the protection layer 300a.

In an embodiment, the board body 30 can be made of a material described in the previous embodiments.

Figure 3B:
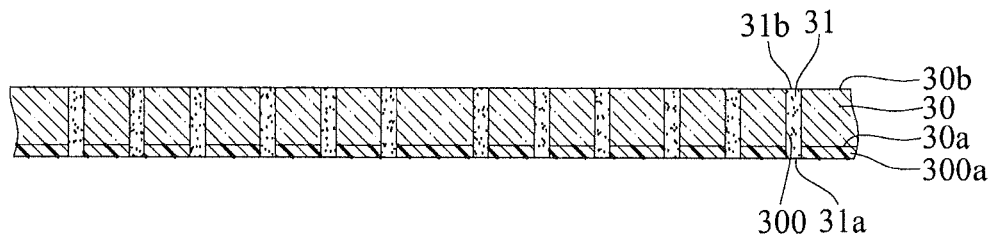

As shown in FIG. 3B, a conductive gel 31 is formed in each of the through holes 300, and has opposing first end 31a and second end 31b.

In an embodiment, the conductive gel 31 is applied and fills each of the through holes 300. The second end 31b of the conductive gel 31 is flush with the second surface 30b of the board body 30.

Figure 3C:
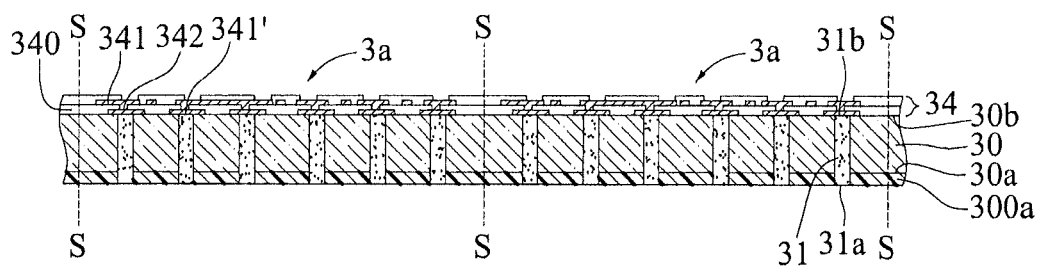

As shown in FIG. 3C, a circuit redistribution structure 34 is disposed on the second surface 30b of the board body 30, to form an interposer plate including a plurality of interposers 3a. The circuit redistribution structure 34 is electrically connected to the second end 31b of the conductive gel 31.

In an embodiment, the circuit redistribution structure 34 has at least a redistribution dielectric layer 340, and redistribution circuit layers 341,341' formed on the redistribution dielectric layer 340. A portion of the redistribution circuit layer 341' (i.e., the innermost layer) is electrically connected to the second ends 31b of the conductive gels 31.

The circuit redistribution structure 34 further has a plurality of redistribution conductive vias 342 formed in the redistribution dielectric layer 340 and electrically connected to the redistribution circuit layers 341,341'.

The surfaces of the second ends 31b of the conductive gels 31 are flush with the second surface 30b of the board body 30, and the innermost layer of the redistribution circuit layer 341' is in direct contact with the surfaces of the second ends 31b of the conductive gels 31 and electrically connected to the second ends 31b of the conductive gels 31.

Therefore, the innermost layer of the redistribution circuit layer 341' can be still electrically connected to the second ends 31b of the conductive gels 31, with passing through the redistribution conductive vias 342.

In an embodiment, the redistribution circuit layer can be embedded in the redistribution dielectric layer.

Figure 3D:
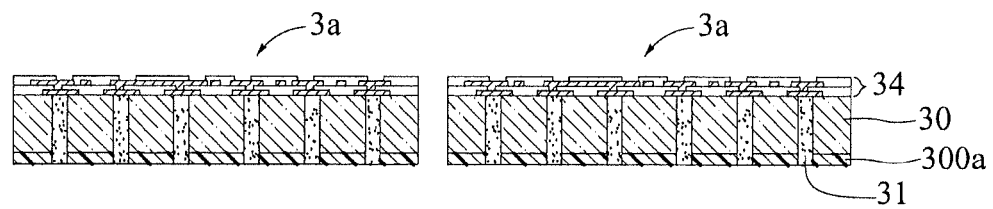

As shown in FIG. 3D, a singulation process is performed along the cutting line of the interposer plate (i.e., a cutting line denoted by S shown in FIG. 3C), to separate the interposer plate to obtain a plurality of interposers 3a.

Figure 3E:
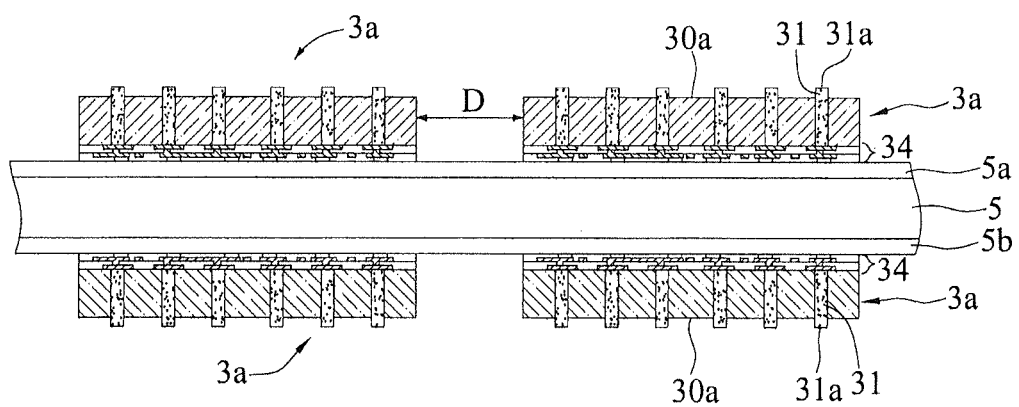

As shown in FIG. 3E, the interposers 3a are disposed on two opposing sides 5a, 5b of a carrier 5, with the circuit redistribution structure 34 facing the carrier 5. Then, the protection layer 300a is removed, allowing the first ends 31a of the conductive gels 31 to protrude from the first surface 30a of the interposer 3a.

In an embodiment, the interposers 3a disposed on the same side 5a, 5b of the carrier 5 are spaced at an interval D.

Figure 3F:
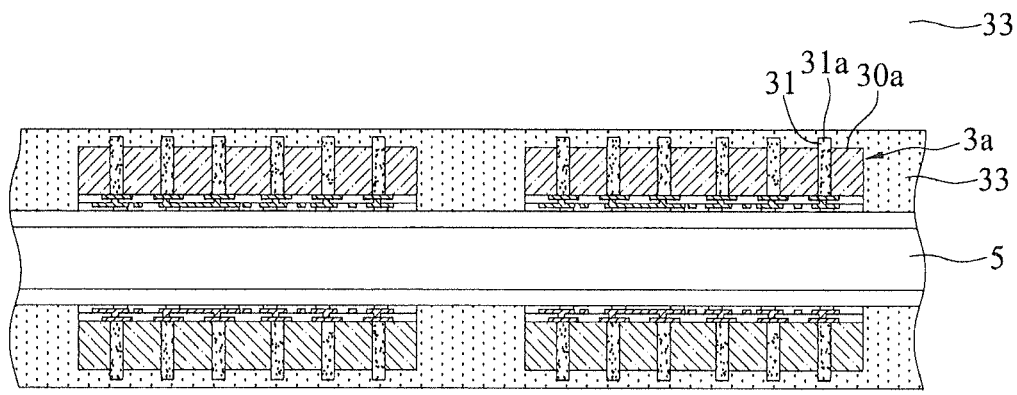

As shown in FIG. 3F, a encapsulating layer 33 is formed on the carrier 5 to encapsulate a periphery and the first surface 30a of each of the interposers 3a.

Figure 3G:
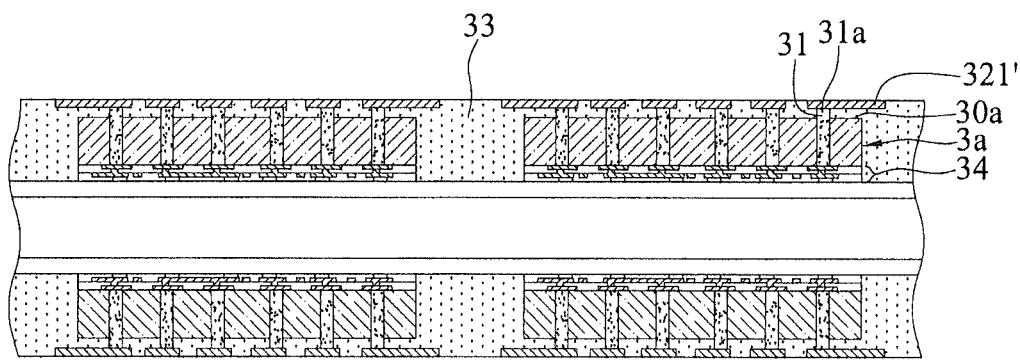
Figure 3G:
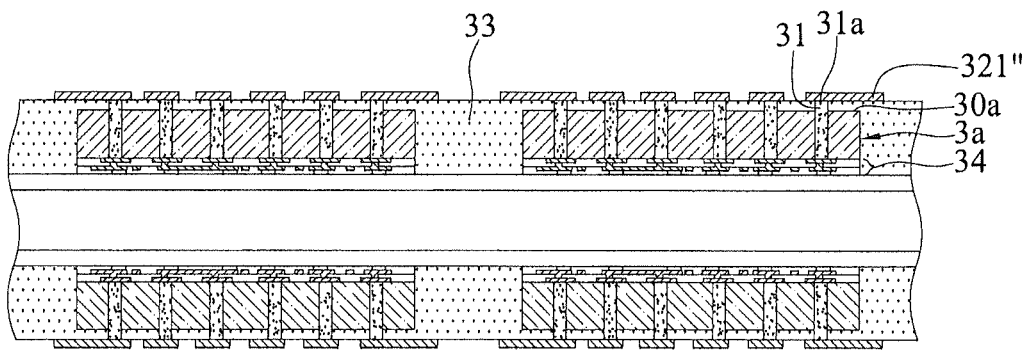
Figure 3H:
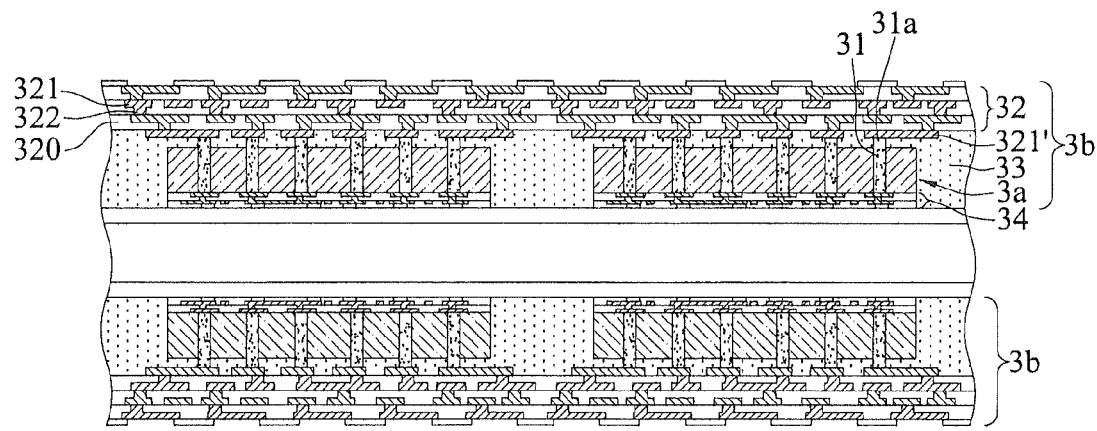

As shown in FIGS. 3G to 3H, a circuit built-up structure 32 is disposed on the encapsulating layer 33 correspondingly above the first surface 30a of each of the interposers 3a, to form two sets of packaging substrate panels 3b. The circuit built-up structure 32 is electrically connected to the first ends 31a of the conductive gels 31.

In an embodiment, the circuit built-up structure 32 has at least a built-up dielectric layer 320, a built-up circuit layer 321 formed on the built-up dielectric layer 320, and a plurality of built-up conductive vias 322 formed in the built-up dielectric layer 320 and electrically connected to the built-up circuit layer 321.

A portion of the built-up circuit layer 321' is further embedded in the encapsulating layer 33, as shown in FIG. 3G, allowing the circuit built-up structure 32 to be electrically connected to the first ends 31a of the conductive gels 31 through the built-up circuit layer 321' of the encapsulating layer 33. In another embodiment, the surfaces of the first ends 31a of the conductive gels 31 can be flush with the surface of the encapsulating layer 33 by reducing the thickness of the encapsulating layer 33 shown in FIG. 3F in the process, and the built-up circuit layer 321" can be formed on the surface of the encapsulating layer 33 and electrically connected to the first ends 31a of the conductive gels 31 when the circuit built-up structure 32 is fabricated, as shown in FIG. 3G'.

In an embodiment, the built-up circuit layer 321 is embedded in the built-up dielectric layer 320. In another embodiment, the built-up circuit layer 321 can be formed on the surface of the built-up dielectric layer 320.

The circuit built-up structure 32 and the circuit redistribution structure 34 are fabricated by different processes. The circuit built-up structure 32 is fabricated by equipment that fabricate a panel including a plurality of packaging substrate units, while the circuit redistribution structure 34 is fabricated by equipment that fabricate a semiconductor wafer including a plurality of semiconductor dies.

Figure 3I:
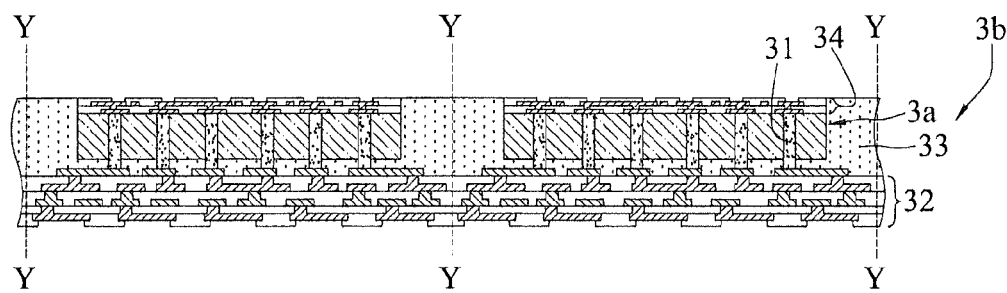

As shown in FIG. 3I, the carrier 5 is removed, to obtain a packaging substrate panel composed of a plurality of packaging substrates 3b. A singulation process is performed on packaging substrate panel along a cutting line Y so as to separate the packaging substrate units 3b to obtain a plurality of packaging substrates 3.

Figure 3J:
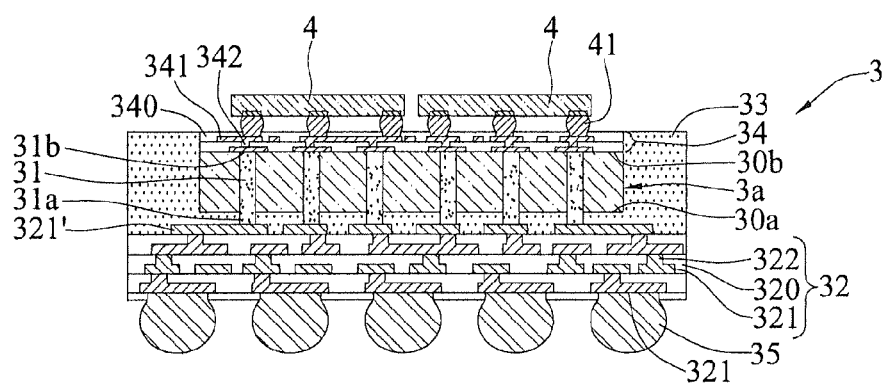

As shown in FIG. 3J, an application of a package structure according to the present invention is provided. In subsequent processes, at least a semiconductor chip 4 is bonded and electrically connected through solder bumps 41 to a portion of a surface (i.e., flip-chip pads) of an outermost side of the redistribution circuit layer 341 of the circuit redistribution structure 34 of the packaging substrate 3, and a portion of a surface (i.e., ball implanting pads) of the outermost side of the built-up circuit layer 321 of the circuit built-up structure 32 of the packaging substrate 3 is electrically connected through solder balls 35 to an electronic device such as a printed circuit board (not shown).

In the present invention, since the interposer 3a is embedded in the encapsulating layer 33, the overall thickness of the packaging substrate 3 is reduced.

Besides, since the packaging substrate 3 is electrically connected to the interposer 3a through the circuit built-up structure 32, the fabrication cost is reduced and the electrical property is improved.

Moreover, since the interposer 3a and the silicon wafer have the same or similar CTEs, the reliability of thermal cycle test after packaging is enhanced. Therefore, the disposition of the semiconductor chip 4 on the interposer 3a of the packaging substrate 3 increases the reliability of a product, as compared with the flip-chip packaging substrate according to the prior art.

Since the first end 31a of the conductive gel 31 protrudes from first surface 30a of the interposer 3a, the built-up circuit layer 321' of the circuit built-up structure 32 is in direct contact with the first end 31a of the conductive gel 31, without using the built-up conductive vias 322 to be in contact with the first end 31a of the conductive gel 31. Therefore, the via alignment process is omitted and the fabrication period is shortened. Also, the via offset and poor electrical connection problems are thus solved. Accordingly, the packaging substrate 3 embedded with the interposer 3a according to the present invention has improved reliability and reduced fabrication cost.

The present invention further provides a packaging substrate 3. As shown in FIG. 3J, the packaging substrate 3 comprises an interposer 3a, a encapsulating layer 33 and a circuit built-up structure 32.

The interposer 3a has opposing first surface 30a and second surface 30b, and a plurality of conductive gels 31 interconnecting the first and second surfaces 30a, 30b. Each of the conductive gels 31 has opposing first end 31a and second end 31b. The first end 31a of the conductive gel 31 protrudes from the first surface 30a of the interposer 3a. The interposer 3a has a circuit redistribution structure 34 disposed on the second surface 30b and electrically connected to the second end 31b of the conductive gel 31.

In an embodiment, the circuit redistribution structure 34 has at least a redistribution dielectric layer 340, redistribution circuit layers 341,341' formed on the redistribution dielectric layer 340, and a plurality of redistribution conductive vias 342 formed in the redistribution dielectric layer 340 and electrically connected to the redistribution circuit layers 341,341'. The innermost layer of redistribution circuit layer 341' is electrically connected to the second end 31b of the conductive gel 31.

The encapsulating layer 33 encapsulates a periphery of the interposer 3a and the first surface 30a of the interposer 3a. In other words, the interposer 3a is embedded in the encapsulating layer 33.

In an embodiment, the encapsulating layer 33 encapsulates a top surface of the first end 31a of the conductive gel 31. In another embodiment, the top surface of the first end 31a of the conductive gel 31 is exposed from a surface of the encapsulating layer 33. For example, the surface of the first end 31a of the conductive gel 31 is flush with a surface of the encapsulating layer 33.

The circuit built-up structure 32 is disposed on a encapsulating layer 33 correspondingly above the first surface 30a of the interposer 3a and electrically connected to the first end 31a of the conductive gel 31.

In an embodiment, the circuit built-up structure 32 has at least a built-up dielectric layer 320, a built-up circuit layer 321 formed on the built-up dielectric layer 320, and a plurality of built-up conductive vias 322 formed in the built-up dielectric layer 320 and electrically connected to the built-up circuit layer 321. The built-up circuit layer 321' is further embedded in the encapsulating layer 33 and electrically connected to the first end 31a of the conductive gel 31 and the built-up conductive vias 322. In another embodiment, the built-up circuit layer 321" is formed on a surface of the encapsulating layer 33 and electrically connected to the first end 31a of the conductive gel 31.

In the through-holed interposer, the packaging substrate and methods of fabricating the through-holed interposer and the packaging substrate, the first end of the conductive gel protrudes from the first surface of the interposer. Therefore, the through-holed interposer and the packaging substrate has improved reliability.

Since the through-holed interposer (or interposer) is combined with the semiconductor chip and the through-holed interposer and the semiconductor chip has the same CTEs, the solder bumps disposed between the semiconductor chip and the through-holed interposer are prevented to be cracked, and a produce having the through-holed interposer has improved reliability.

Through the design of the through-holed interposer (or interposer), the first circuit redistribution structure (or a circuit built-up structure) is electrically connected to soldering pads of a packaging substrate, and the second circuit redistribution structure (or a circuit redistribution structure) is electrically connected to electrode pads of the semiconductor chip that have smaller pitches. Therefore, the packaging substrate can be combined with a semiconductor chip having electrode pads arranged in a high layout density.

Since the interposer is embedded in the encapsulating layer to form a packaging substrate embedded with the interposer, the overall thickness of the package structure is reduced.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A packaging substrate, comprising:
an interposer having opposing first and second surfaces and a plurality of conductive gels interconnecting the first surface and the second surface, wherein each of the conductive gels has opposing first and second ends, such that the first end protrudes from the first surface of the interposer, and a circuit redistribution structure is disposed on the second surface of the interposer and electrically connected to the second ends of the conductive gels;
an encapsulating layer that encapsulates and is in direct contact with side surfaces and the first surface of the interposer; and
a circuit built-up structure disposed on the encapsulating layer above the first surface of the interposer and electrically connected to the first ends of the conductive gels.

2. The packaging substrate of claim 1, wherein the circuit built-up structure has at least a built-up dielectric layer, and a built-up circuit layer formed on the built-up dielectric layer and electrically connected to the first ends of the conductive gels.

3. The packaging substrate of claim 2, wherein the built-up circuit layer is embedded in the encapsulating layer.

4. The packaging substrate of claim 3, wherein the circuit built-up structure further comprises a plurality of built-up conductive vias formed in the built-up dielectric layer and electrically connected to the built-up circuit layer.

5. The packaging substrate of claim 1, wherein the circuit redistribution structure has at least a redistribution dielectric layer, and a redistribution circuit layer formed on the redistribution dielectric layer and electrically connected to the second ends of the conductive gels.

6. The packaging substrate of claim 5, wherein the circuit redistribution structure further has a plurality of redistribution conductive vias formed in the redistribution dielectric layer and electrically connected to the redistribution circuit layer.

* * * * *